(12) United States Patent
Asam et al.

(10) Patent No.: US 8,872,552 B2
(45) Date of Patent: Oct. 28, 2014

(54) HIGH-SIDE SEMICONDUCTOR-SWITCH LOW-POWER DRIVING CIRCUIT AND METHOD

(71) Applicant: Infineon Technologies Austria AG, Villach (AT)

(72) Inventors: Michael Asam, Sainbach (DE); Helmut Herrmann, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/631,928

(22) Filed: Sep. 29, 2012

(65) Prior Publication Data
US 2014/0091840 A1    Apr. 3, 2014

(51) Int. Cl.
*H03K 3/00* (2006.01)
(52) U.S. Cl.
USPC .......................................... 327/108; 327/112
(58) Field of Classification Search
USPC .................................................. 327/108, 112
See application file for complete search history.

(56) References Cited

U.S. PATENT DOCUMENTS

| | | | | |
|---|---|---|---|---|
| 5,365,118 A * | 11/1994 | Wilcox | ......................... | 327/109 |
| 5,969,565 A * | 10/1999 | Naganawa | ..................... | 327/536 |
| 6,128,242 A * | 10/2000 | Banba et al. | ................... | 365/226 |
| 6,282,108 B1 * | 8/2001 | Yang | ................................ | 363/60 |
| 6,320,457 B1 * | 11/2001 | Yang | ................................ | 327/536 |
| 6,411,531 B1 * | 6/2002 | Nork et al. | ....................... | 363/60 |
| 6,567,309 B2 * | 5/2003 | Tanzawa | ................... | 365/185.18 |
| 6,603,341 B2 * | 8/2003 | Tuchiya et al. | ................. | 327/390 |
| 6,657,876 B2 * | 12/2003 | Satoh | ............................... | 363/60 |
| 6,724,242 B2 * | 4/2004 | Kim et al. | ....................... | 327/536 |
| 6,781,439 B2 * | 8/2004 | Tanzawa et al. | ............... | 327/536 |
| 6,930,535 B2 * | 8/2005 | Kim | ............................... | 327/536 |
| 7,012,843 B2 * | 3/2006 | Schroegmeier et al. | . | 365/189.11 |
| 7,180,794 B2 * | 2/2007 | Matsue | ..................... | 365/189.09 |
| 7,239,554 B2 * | 7/2007 | Jeong | ....................... | 365/185.28 |
| 7,310,006 B2 * | 12/2007 | Shimada | ........................... | 326/83 |
| 7,443,230 B2 * | 10/2008 | Chen et al. | ..................... | 327/535 |
| 7,501,881 B2 * | 3/2009 | Youn et al. | ..................... | 327/536 |
| 7,606,015 B2 * | 10/2009 | Tanabe | .......................... | 361/93.1 |
| 7,948,302 B2 * | 5/2011 | Neto et al. | ...................... | 327/536 |
| 7,956,675 B2 * | 6/2011 | Saitoh et al. | .................... | 327/536 |
| 7,973,592 B2 * | 7/2011 | Pan | ................................ | 327/536 |

* cited by examiner

*Primary Examiner* — Kenneth B. Wells
(74) *Attorney, Agent, or Firm* — Slater & Matsil, L.L.P.

(57) ABSTRACT

A high-side semiconductor-switch driving method includes generating power for controlling a high side semiconductor switch. The high side semiconductor switch has a control terminal and the power allows a current to flow into the control terminal of the high side semiconductor switch to switch the high side semiconductor switch. The voltage at the control terminal of the high side semiconductor switch is quantified. The power dependent on the voltage at the control terminal of the high side semiconductor switch is controlled so that the current provided is increased when the voltage at the control terminal indicates that the current is not sufficient to switch the high side semiconductor switch.

24 Claims, 3 Drawing Sheets

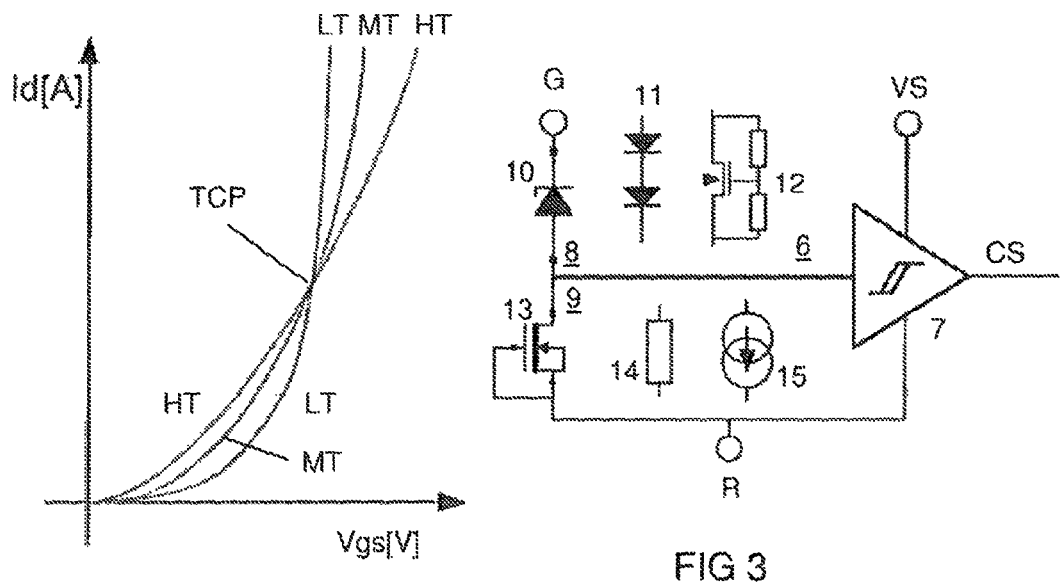
FIG 1
FIG 3
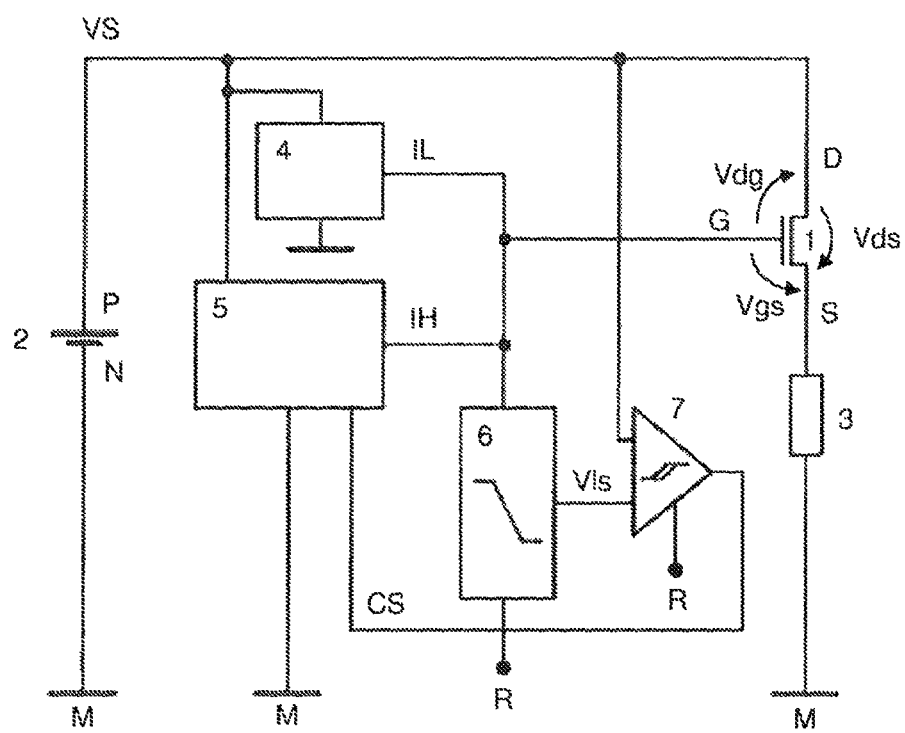
FIG 2

HIGH-SIDE SEMICONDUCTOR-SWITCH LOW-POWER DRIVING CIRCUIT AND METHOD

TECHNICAL FIELD

The present invention relates generally to electronic devices and, in particular embodiments, to high-side semiconductor-switch low-power driving circuits and methods.

BACKGROUND

High-side switches, for instance n-channel enhancement-mode metal oxide semiconductor field-effect transistors (MOSFET), are broadly used due to their low on-resistance but require a charge pump for the generation of adequate control voltages. These charge pumps are required to have low power consumption but should provide high output currents—which are conflicting requirements. For instance, in automotive applications some high-side switches are turned on even when the car carrying the switches is turned off. This means that the power consumed by the high-side switches is drawn from the car battery, which has a limited capacity. Most power consumption occurs when a high-side switch is turned on because in this phase a charge pump commonly present in high-side semiconductor-switch driver circuits is active and generates from a supply voltage a voltage for controlling the high-side switches which is higher than the supply voltage. The supply voltage is provided by the car power network, including the car battery which is the only power source when the car is turned off. Therefore, it is desirable to provide improved driving circuits and methods to control these switches.

SUMMARY OF THE INVENTION

A high-side semiconductor-switch driver circuit in accordance with an embodiment of the present invention includes a controllable charge pump circuit operable to control a high side semiconductor switch, wherein the high side semiconductor switch has a control terminal and the charge pump circuit provides a current to the control terminal of the high side semiconductor switch for switching the high side semiconductor switch. An evaluation circuit is connected to the charge pump circuit and is operable to quantify the voltage at the control terminal of the high side semiconductor switch and to control the charge pump circuit dependent on the voltage at the control terminal of the high side semiconductor switch so that the current provided by the charge pump circuit is increased when the voltage generated by the current from the charge pump circuit is not sufficient to switch the high side semiconductor switch.

A high-side semiconductor-switch driving method in accordance with another embodiment of the present invention includes generating power for controlling a high side semiconductor switch, wherein the high side semiconductor switch has a control terminal and the power allows a current to flow into the control terminal of the high side semiconductor switch to switch the high side semiconductor switch; determining the voltage at the control terminal of the high side semiconductor switch; and controlling the power dependent on the voltage at the control terminal of the high side semiconductor switch so that the current provided is increased when the voltage at the control terminal indicates that the current is not sufficient to switch the high side semiconductor switch.

Other features and advantages of the present invention will become apparent from the following description of the invention which refers to the accompanying drawings.

BRIEF DESCRIPTION OF THE DRAWINGS

The more complete understanding of the present invention, and the advantages thereof, reference is now made to the following descriptions taken in conjunction with the accompanying drawing, in which:

FIG. 1 is a chart illustrating measured drain currents of an n-channel enhancement-mode field-effect transistor over gate-source voltage at different temperatures;

FIG. 2 is a block diagram of a driver circuit in accordance with a first embodiment of the present invention;

FIG. 3 is a block diagram of a level shifter for use in the high-side semiconductor-switch driver circuit of FIG. 2;

DETAILED DESCRIPTION OF ILLUSTRATIVE EMBODIMENTS

Figure 4:
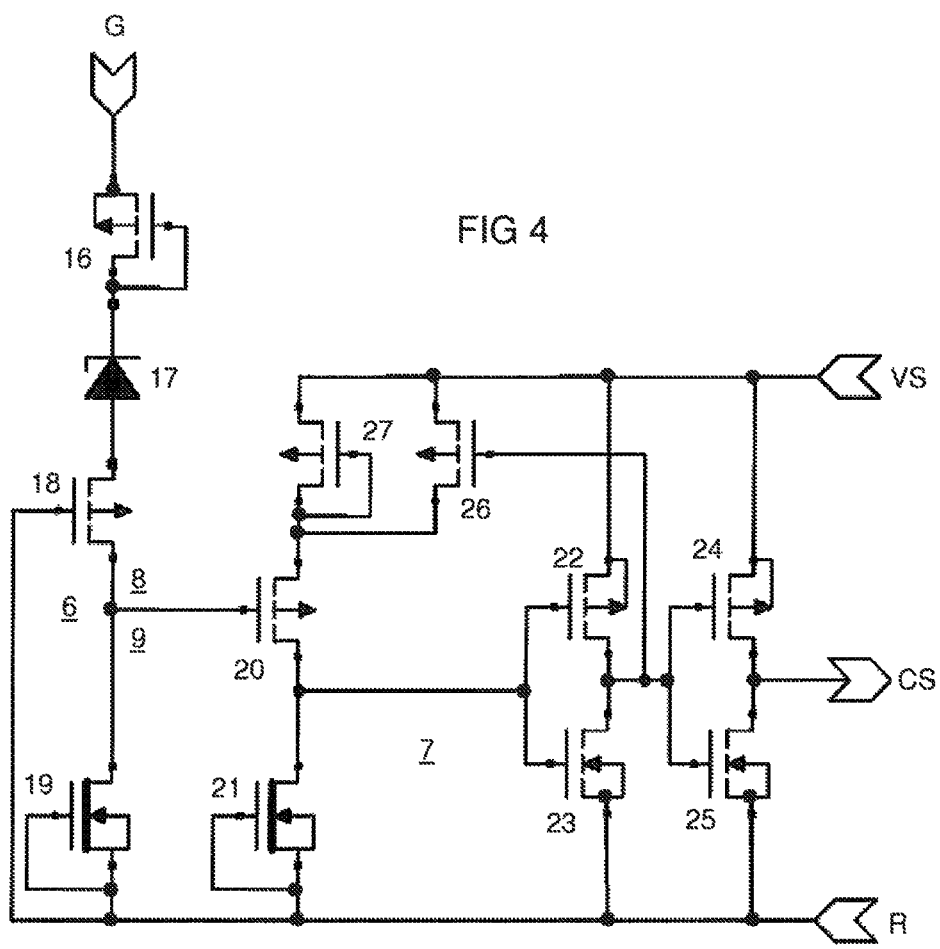
FIG. 4 is a circuit diagram of a detector circuit in accordance with a second embodiment of the present invention.

A common approach to keeping the power consumption of high-side semiconductor-switch driver circuits low is optimizing the efficiency of the charge pumps. However, the charge pump should provide sufficient current (a) when charging the input capacitance of the high-side semiconductor switch, e.g., the gate capacitance of a metal-oxide-semiconductor field-effect transistor (MOSFET) or an insulated gate bipolar transistor (IGBT); and (b) at high temperatures. At any other time the charge pump needs to deliver only a small amount of current. In order to switch between "low" current and "high" current or vice versa, an assessment has to be made of when the high-side semiconductor-switch (in the following also referred to as "switch") needs a lower or higher current. A lower current is sufficient if, for instance, the gate capacity is fully charged. The current needed to maintain this charge is much lower than to charge the capacitance from a, e.g., discharged state such as, e.g., at the transient from "off" state to "on" state.

One way to assess the charging status of the input capacitance (if switching is desired) is to measure the voltage over the load path of the switch, which may be, e.g., the drain-source path of a metal-oxide-semiconductor field-effect transistor (MOSFET) or the collector-emitter path of an insulated gate bipolar transistor (IGBT). The voltage over the load path of the switch may be very low, e.g., about 10 mV or lower, so that the voltage measurements at the load path are heavily affected by noise and offset voltages of the measuring circuit, which make the measurements inaccurate. Furthermore, the voltage over the load path of the switch depends on the current flowing through the load path so that the measured voltage per se is not sufficient to assess the charge status of the input capacitance of the switch. The voltage over the load path of the switch gives no indication, either, at what bias point the switch is operated. FIG. 1 illustrates the drain current Id[A] of an n-channel enhancement-mode MOSFET over its gate-source voltage Vgs[V] for three different temperatures, namely a high temperature HT, a medium temperature MT and a low temperature LT. For a high current switch it is essential that the gate source voltage Vgs is higher than that on the temperature compensated point TCP. If the gate source voltage Vgs is smaller than that at the temperature compensated point TCP at high currents, the switch will be damaged or even destroyed because of current filamentation. Thus, the charge pump is required to deliver high currents.

The driver circuits described herein assess the relevant input voltage at the input of the switch. For instance, the gate-source voltage of a MOSFET in on state may be picked up between gate and the high-side of a supply voltage source, which is the same potential as the MOSFET's drain. However, the drain-source voltage (some millivolts) is negligible compared to the gate voltage (some volts) necessary to switch the MOSFET, so that the gate-source voltage Vgs and the gate-drain-voltage Vgd are essentially identical (Vgs≈Vgd). The dynamics of the gate voltage Vg are directly influenced by the current from the charge pump(s), i.e., the gate current. Furthermore, the gate voltage Vg quantifies (measures, determines, evaluates) the bias point of the MOSFET which is important for the temperature behavior of the MOSFET. The gate voltage is some volts (V) so that offset and noise of the evaluation circuit, which are in the millivolts (mV), have essentially no relevance.

Referring now to FIG. 2, an exemplary n-channel high-side semiconductor-switch arrangement includes a high-side semiconductor-switch, which is in the present example an n-channel MOSFET 1 but may be any other suitable semiconductor switch such as an IGBT or the like. The MOSFET 1 has a drain D that is connected to a positive pole P with a (positive) supply voltage VS of a supply voltage source 2 whose other (negative) pole N is connected to ground M and through a load 3 to a source S of the MOSFET 1.

A gate G of MOSFET 1 is connected to a drive circuit that comprises two charge pumps 4 and 5 whose outputs are connected to the gate G and whose supply lines are connected to the positive pole VS and the negative pole M of the supply voltage source 2. Charge pump 4 draws a lower supply current and provides a lower current IL to the gate G of MOSFET 1. Charge pump 5 draws a higher supply current and provides a higher current IH to the gate G of MOSFET 1, in which IL<IH. At least the charge pump 5 is controllable. Thus, if it is desired to switch the MOSFET 1 on (conducting state), there are two options in the present example: (a) either charge pump 4 or charge pump 5 is switched on (active) at a time, i.e., the current IG flowing into the gate G ("gate current") is either IL or IH, or (b) the charge pump 4 is permanently switched on (active) and charge pump 5 is switched on (active) and off (not active) as the case may be, i.e., the gate current IG is either IL or IL+IH. The gate current IG generates a gate-source voltage Vgs between gate G and source S of MOSFET 1 and a gate-drain voltage Vgd between gate G and drain D of MOSFET 1, whereby Vgd≈Vgs when the MOSFET 1 is switched on (conducting state). Charge pumps 4 and 5 are intended to provide output voltages that exceed the voltage VS by the intended magnitude of the gate-source voltage Vgs (referenced to ground M) and may be of any appropriate type such as, e.g., of the bootstrap type, capacitive type or inductive type converter or combinations thereof.

A level shifter 6 is supplied with gate-drain voltage Vgd and shifts this gate-drain voltage Vgd to voltage Vls, which is referenced to a reference potential such as an internally generated lower supply voltage (herein referred to as internal supply voltage R), which is in the present case a certain amount (e.g., 5V) below voltage VS. The voltage Vls which represents the gate-drain voltage Vgd and, thus, the gate-source voltage Vgs, is supplied to a comparator 7, which may or may not exhibit a hysteresis behavior (as e.g., a Schmitt trigger), for comparison with a reference value, e.g., the supply voltage VS or a fraction thereof. The comparator 7, which is also referenced to the internal supply voltage R, evaluates the voltage Vls representing the shifted gate voltage Vg and decides whether the current IL provided by the charge pump 4 is sufficient or a boost from charge pump 5 is needed in order to generate a gate voltage Vg that is sufficient to switch the high-side switch 1. The status quantified (measured, determined, evaluated) by the comparator 7 is indicated by a control signal CS.

Measurement of the gate-source voltage Vgs may take place right in the gate path, so that a circuit for measuring the gate-source voltage Vgs is to be supplied essentially by charge pump 4. As charge pumps have a rather poor efficiency and measuring circuits need a rather high supply current, the overall power consumption of the driver circuit would be relatively high. In the driver circuit of FIG. 2, the measurement/evaluation circuit, which is here the comparator 7, is supplied with the supply voltage VS.

A simple level shifter and evaluation circuit applicable in the driver circuit of FIG. 2 is shown in FIG. 3. The level shifter part of the circuit of FIG. 3 has an upper branch 8 (pumped voltage rail) and a lower branch 9 (high-side rail). One end of the upper branch 8 forms the level shifter input and is connected to the gate G of MOSFET 1 and the other end forms the level shifter output and is connected to the input of comparator 7. The upper branch 8 may include a Zener diode 10 and additionally or alternatively one of a single diode, a series circuit of diodes 11 and/or a diode-wise connected transistor 12 (gate-source multiplier). The lower branch 9 is connected between the input of comparator 7 (level shifter output) and internal supply voltage R, and may include a current-source-wise connected transistor 13 and additionally or alternatively one of a resistor 14 and/or a current source 15. In the level shifter part, the lower branch 9 determines the current and the high-side-branch 8 limits (determines) the voltage.

FIG. 4 is a detailed circuit diagram of another level shifter and evaluation circuit. The level shifter high-side path 8, which is connected between the level shifter input (connected to gate G of MOSFET 1) and level shifter output (connected to comparator 7), includes a series connection of a diode-wise connected low-voltage p-channel enhancement MOSFET 16, a Zener diode 17 and the drain-source path of a high-voltage n-channel enhancement MOSFET 18 whose gate is connected to the internal supply voltage R and whose source forms the output of the level shifter. In particular, the source of MOSFET 16 is connected to gate voltage Vg and its gate and drain are connected to the cathode of the Zener diode 17 whose anode is connected to the drain of MOSFET 18. The level shifter low-side path 9, which is connected between the level shifter output and internal supply voltage R, includes a current-source-wise connected low-voltage n-channel depletion MOSFET 19.

The subsequent comparator 7 is a Schmitt trigger whose input is formed by the gate of a low-voltage n-channel enhancement MOSFET 20. The drain of the MOSFET 20 is connected to the internal supply voltage R via a current-source-wise connected low-voltage n-channel depletion MOSFET 21 and directly to the coupled gates of a low-voltage p-channel enhancement MOSFET 22 whose source is connected to voltage VS and a low-voltage n-channel enhancement MOSFET 23 whose source is connected to the internal supply voltage R. The drains of MOSFETs 22 and 23 are coupled with each other, with the coupled gates of a low-voltage p-channel enhancement MOSFET 24 and a low-voltage n-channel enhancement MOSFET 25, and with the gate of a low-voltage p-channel enhancement MOSFET 26. The drains of MOSFET 24 whose source is connected to voltage VS and MOSFET 25 whose source is connected to ground M are coupled with each other to form the output of the comparator 7 at which the control signal CS is provided. The source of MOSFET 26 is connected to voltage VS and its drain is connected to the source of MOSFET 20 and to the drain of a low-voltage p-channel enhancement MOSFET 27 whose source is connected to voltage VS and whose gate is connected to its drain. The body terminals of MOSFETs 19, 21, 23 and 25 are connected to the internal supply voltage R; the body terminals of MOSFETs 16, 22 and 24 are connected to voltage VS; and the body terminals of MOSFETs 18, 20, 26 and 27 are connected to substrate.

Zener diode 17 takes care of the basic level shift (e.g., 6.2 V) while MOSFET 16 provides an additional level shift to compensate for the voltage drop caused by the hysteresis circuit established by MOSFETs 26 and 27. MOSFET 18 is a high-voltage transistor in order to provide sufficient protection for the comparator 7 against voltage peaks. MOSFET 19 serves as a current source (e.g., 100 nA) supplied by the gate voltage of MOSFET 1. MOSFET 21 serves as a further current source (e.g., 500 nA) supplied by the supply voltage VS. The gate of MOSFET 20 forms the input of the comparator 7. MOSFET 27 defines one and MOSFET 26 the other hysteresis condition, i.e., the two reference values. For instance, the gate G of MOSFET 1 may be fully charged at a voltage of 6.2 V. If the voltage at the gate G drops below 4.5 V, the (boosting) charge pump 5 may be activated until a voltage of, e.g., 5.5 V is reached where it is deactivated again. Therefore, the voltage at the gate G is shifted down by about 7 V by way of the MOS diode established by MOSFET 16 and the Zener diode 10 to be supplied to the gate of MOSFET 20. If the voltage at the gate of MOSFET 20 drops below the higher reference value or exceeds the lower reference value, the charge pump 5 is turned on or off (and charge pump 4 may be turned off and on, if not constantly on).

Figure 5:
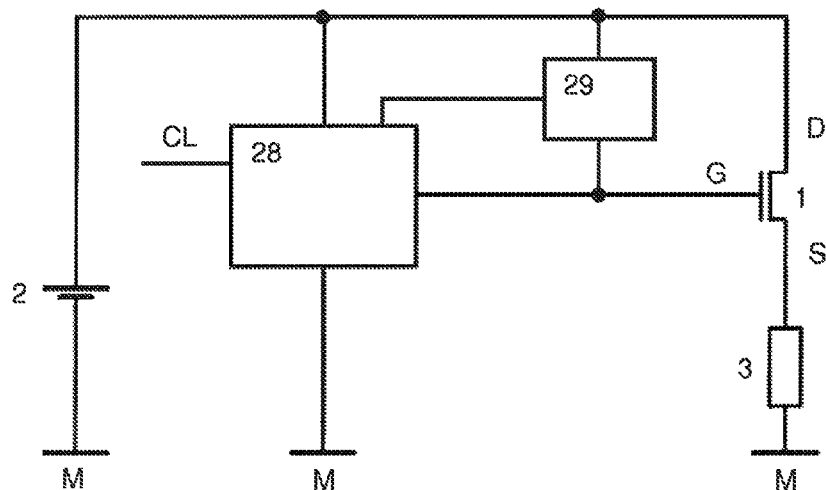
FIG. 5 is a block diagram of a driver circuit in accordance with a third embodiment of the present invention.

FIG. 5 illustrates a high-side semiconductor-switch driver circuit whose output current and, thus, whose power consumption is continuously controllable dependent of the gate voltage of MOSFET 1. Only one charge pump 28 is provided, which may be a clocked capacitive or inductive DC-DC converter. For instance, by controlling the clock frequency of the charge pump 28 dependent on the gate voltage of MOSFET 1, the output current and power consumption of the charge pump 28 can be controlled. The gate voltage of MOSFET 1 is picked up by a level shifter 29 and shifted into voltage range that can be handled by the charge pump 28. The input of level shifter 29 is connected to the gate G of MOSFET 1 and its output is connected to the charge pump 28, whereby level shifter 29 is referenced to voltage VS and charge pump 28 is referenced to ground M. The charge pump 28 may be switched on and off by a control signal supplied via a control line CL.

The high-side semiconductor-switches described above, therefore, generate power for controlling a high side semiconductor switch (1), e.g., by way of the charge pump(s) 4 and 5, or 28. The high side semiconductor switch (1) has a control terminal (G) and the power allows a current that generates the gate voltage Vg to flow into the control terminal (G) of the high side semiconductor switch (1) to switch the high side semiconductor switch (1). The minimum voltage at the control terminal (G) of the high side semiconductor switch (1) is quantified (measured, determined, evaluated), e.g., by the comparator 7 or the controllable charge pump 28 through the level shifter 6 or 29. The power provided by the charge pump (s) 4 and 5, or 28 is dependent on the voltage at the control terminal (G) of the high side semiconductor switch (1) so that the current provided is increased when the voltage at the control terminal (G) indicates that the gate voltage Vg generated by the current from the charge pump(s) is not sufficient to switch the high side semiconductor switch (1), e.g., if switching is desired.

Figure 6:
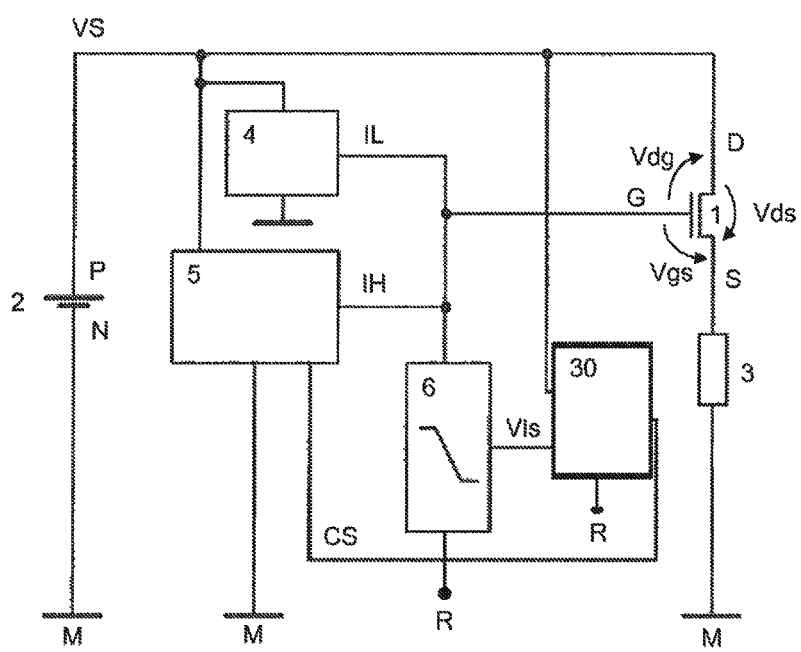
FIG. 6 is a block diagram of a driver circuit in accordance with a second embodiment of the present invention.

FIG. 6 illustrates an embodiment high-side switch driver circuit similar to the n-channel high side semiconductor-switch arrangement described in reference to FIG. 2. In the embodiment high-side switch driver circuit of FIG. 6, linear control circuit 30 is coupled downstream of level shifter 6 and upstream of charge pump 5. Linear control circuit 30 is configured to provide an analog signal at its output. In some embodiments, charge pump 5 is a linear controllable charge pump.

Although the examples shown use only n-channel enhancement-mode MOSFET, p-channel enhancement-mode MOSFET, n-channel depletion-mode MOSFET, p-channel depletion-mode MOSFET may be employed as well.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high-side semiconductor-switch driver circuit comprising:
a controllable charge pump circuit operable to control a high side semiconductor switch, wherein the high side semiconductor switch has a control terminal and the charge pump circuit provides a current to the control terminal of the high side semiconductor switch for switching the high side semiconductor switch; and
an evaluation circuit coupled to the charge pump circuit, the evaluation circuit operable to quantify a voltage at the control terminal of the high side semiconductor switch by comparing the voltage at the control terminal of the high side semiconductor switch with a supply voltage at a conduction terminal of the high side semiconductor switch and to control the charge pump circuit dependent on the quantified voltage so that the current provided by the charge pump circuit is increased when the quantified voltage indicates that the current is not sufficient to switch the high side semiconductor switch.

2. The high-side switch driver circuit of claim 1, wherein the evaluation circuit comprises a level shifter with an input and output, the input of the level shifter being supplied with the voltage at the control terminal of the high side semiconductor switch, wherein the level shifter is configured to shift high-side levels supplied to its input to low-side levels provided at its output.

3. The high-side switch driver circuit of claim 2, wherein the level shifter has an upper branch and a lower branch, the upper branch being coupled between the level shifter input and the level shifter output, the upper branch comprising at least one of a diode, a Zener diode, a series circuit of diodes, a gate-source multiplier and a diode-wise connected transistor, the lower branch being coupled between the level shifter output and a reference potential and comprising at least one of a transistor, a resistor and a current source.

4. The high-side switch driver circuit of claim 2, wherein the evaluation circuit further comprises a comparator coupled downstream of the level shifter output and upstream of the charge pump circuit, the comparator configured to compare low level signals provided by the level shifter with a reference signal to provide a digital signal at its output.

5. The high-side switch driver circuit of claim 2, wherein the evaluation circuit further comprises a Schmitt-trigger coupled downstream of the level shifter output and upstream of the charge pump circuit, the Schmitt trigger configured to compare low level signals provided by the level shifter with the supply voltage at the conduction terminal of the high side semiconductor switch and a reference signal to provide a digital signal at its output.

6. The high-side switch driver circuit of claim 2, wherein the evaluation circuit further comprises a linear control circuit coupled downstream of the level shifter output and upstream of the charge pump circuit, the linear control circuit configured to provide an analog signal at its output.

7. The high-side switch driver circuit of claim 1, wherein the controllable charge pump circuit comprises a linear controllable charge pump.

8. The high-side switch driver circuit of claim 1, wherein the controllable charge pump circuit comprises a plurality of switchable charge pumps, at least one switchable charge pump being switched active or inactive dependent at least on the quantified voltage at the control terminal of the high side semiconductor switch.

9. The high-side switch driver circuit of claim 8, wherein at any time minimum one of the charge pumps is switched active.

10. The high-side switch driver circuit of claim 8, wherein up to all of the charge pumps are active simultaneously dependent on the quantified voltage at the control terminal of the high side semiconductor switch.

11. The high-side switch driver circuit of claim 10, wherein the charge pumps are operable to provide currents of different strengths.

12. The high-side switch driver circuit of claim 1, wherein the high side semiconductor switch comprises an enhancement or depletion mode semiconductor.

13. The high-side switch driver circuit of claim 12, wherein the enhancement or depletion mode semiconductor is a metal-oxide-semiconductor field-effect transistor or an insulated gate bipolar transistor, the control terminal being a gate terminal of the metal-oxide-semiconductor field-effect transistor or insulated gate bipolar transistor.

14. The high-side switch driver circuit of claim 1, wherein the high-side switch driver circuit is controlled by a switch-control signal.

15. The high-side switch driver circuit of claim 1, wherein the controllable charge pump comprises a single charge pump.

16. The high-side switch driver circuit of claim 1, wherein comparing the voltage at the control terminal of the high side semiconductor switch with the supply voltage at the conduction terminal of the high side semiconductor switch comprises comparing a level shifted voltage based on the voltage at the control terminal of the high side semiconductor switch with the supply voltage at the conduction terminal of the high side semiconductor switch.

17. The high-side switch driver circuit of claim 1, wherein the conduction terminal of the high side semiconductor switch is a drain terminal.

18. The high-side switch driver circuit of claim 1, further comprising high side semiconductor switch.

19. A high-side semiconductor-switch driving method comprising:
generating power for controlling a high side semiconductor switch, where the high side semiconductor switch has a control terminal and a conduction terminal, and the power allows a current that generates a voltage at the control terminal to flow into the control terminal of the high side semiconductor switch to switch the high side semiconductor switch;
quantifying the voltage at the control terminal of the high side semiconductor switch, wherein quantifying the voltage comprises shifting a level of the voltage at the control terminal with a level shifter and comparing a level shifted output based on the voltage at the control terminal with a supply voltage at the conduction terminal; and
controlling the power dependent on the voltage at the control terminal of the high side semiconductor switch via the comparison so that the current provided is increased when the voltage at the control terminal indicates that the current is not sufficient to switch the high side semiconductor switch.

20. The method of claim 19, wherein generating the power comprises using a single charge pump.

21. The method of claim 19, wherein generating the power comprises using a plurality of charge pumps.

22. A driving circuit comprising:
a first charge pump circuit configured to constantly supply a first current to a control terminal of a high side semiconductor switch;
a second charge pump circuit configured to supply a second current to the control terminal of the high side semiconductor switch, wherein the second current is larger than the first current and the second charge pump circuit supplies the second current based on a control signal; and
a control circuit coupled to the second charge pump circuit, the control circuit configured to supply the control signal based on a comparison between a voltage at the control terminal of the high side semiconductor switch and a supply voltage at a conduction terminal of the high side semiconductor switch, wherein the control circuit switches the second charge pump circuit on when the comparison indicates that the current is not sufficient to switch the high side semiconductor switch.

23. The driving circuit of claim 22, wherein the control circuit comprises a level shifter with an input and output, the input of the level shifter being supplied with the voltage at the control terminal of the high side semiconductor switch, wherein the level shifter is configured to shift high-side levels supplied to its input to low-side levels provided at its output.

24. The driving circuit of claim 23, wherein the control circuit further comprises a comparator coupled to the output of the level shifter and configured to generate the control signal based on a comparison between the output of the level shifter and the supply voltage at the conduction terminal of the high side semiconductor switch.

* * * * *